United States Patent
Hargrove et al.

(10) Patent No.: US 8,361,894 B1
(45) Date of Patent: Jan. 29, 2013

(54) METHODS OF FORMING FINFET SEMICONDUCTOR DEVICES WITH DIFFERENT FIN HEIGHTS

(75) Inventors: Michael J. Hargrove, Clinton Corners, NY (US); Kuldeep Amarnath, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/439,185

(22) Filed: Apr. 4, 2012

(51) Int. Cl.
*H01L 21/425* (2006.01)
(52) U.S. Cl. ............ 438/526; 438/275; 257/E21.4
(58) Field of Classification Search .......... 438/141, 438/519; 257/E21.051, E21.061, E21.37, 257/E21.377, E21.4, E21.457, E21.532, E21.536
See application file for complete search history.

(56) References Cited

U.S. PATENT DOCUMENTS

| 7,098,477 | B2 | 8/2006 | Zhu et al. |
| 7,300,837 | B2 | 11/2007 | Chen et al. |
| 7,384,838 | B2 | 6/2008 | Hsu et al. |
| 7,655,511 | B2 | 2/2010 | Chidambarrao |
| 7,888,192 | B2 | 2/2011 | Marshall et al. |
| 7,915,682 | B2 | 3/2011 | Hsu et al. |
| 7,960,801 | B2 | 6/2011 | Chidambarrao |
| 8,174,058 | B2 | 5/2012 | Marshall et al. |
| 2008/0173942 | A1 | 7/2008 | Zhu et al. |

*Primary Examiner* — Cheung Lee
(74) *Attorney, Agent, or Firm* — Williams, Morgan & Amerson, P.C.

(57) ABSTRACT

One illustrative method disclosed herein includes forming first and second FinFET devices in and above a first region and a second region of a semiconducting substrate, respectively, performing a first ion implantation process through a patterned mask layer to implant nitrogen into the second region, removing the patterned mask layer, performing a second ion implantation process to implant oxygen atoms into both the first and second regions, performing a heating process to form a layer of insulating material at least in the first region and performing at least one etching process to define at least one first fin in the first region and to define at least one second fin in the second region, the second fin being taller than the first fin.

18 Claims, 5 Drawing Sheets

METHODS OF FORMING FINFET SEMICONDUCTOR DEVICES WITH DIFFERENT FIN HEIGHTS

BACKGROUND OF THE INVENTION

1. Field of the Invention

Generally, the present disclosure relates to the manufacture of sophisticated semiconductor devices, and, more specifically, to various methods of forming FinFET semiconductor devices having different fin heights.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. Historically, the FET has been a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as so-called short channel effects, wherein the characteristic of the FET as an active switch is degraded.

In contrast to a planar FET, a FinFET device is a 3-dimensional structure. More specifically, in a FinFET, a generally vertically positioned fin-shaped active area is formed and a gate electrode encloses both sides and an upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device.

The effective gate width ($W_{eff}$) of a single FinFET device is determined by the fin height ($F_h$) and by the number of fins ($N_f$) on the single FinFET device ($W_{eff}=N_f \times F_h$). Typically, FinFETs are made with a singular constant fin height due to the manner in which they are manufactured. As a result, this typically means that, to achieve different effective widths for two different FinFET devices, the number of fins for each of the devices is different. In designing modern integrated circuit products, device designers may need more flexibility in designing the effective gate width for FinFET devices than is afforded by simply increasing or decreasing the number of fins for such devices. There have been attempts in the past to produce FinFETs with different fin heights. One such technique involved initially forming the fins, then implanting germanium into the fins through a mask layer and then performing an anneal process to form a silicon/germanium region on the fin that may be selectively removed relative to silicon by performing an etching process.

The present disclosure is directed to various methods of forming FinFET semiconductor devices having different fin heights.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming FinFET semiconductor devices having different fin heights. In one example, the method includes forming first and second FinFET devices in and above a first region and a second region of a semiconducting substrate, respectively, forming a patterned mask layer above the substrate, the patterned mask layer covering the first region and exposing the second region for further processing, performing a first ion implantation process through the patterned masking layer to implant nitrogen into the second region, and removing the patterned mask layer. The method further includes the steps of performing a second ion implantation process to implant oxygen atoms into both the first and second regions, performing a heating process to cause the implanted oxygen atoms to combine with a material of the substrate to form a layer of insulating material in at least the first region and, after performing the heating process, performing at least one etching process to define at least one first fin in the first region and to define at least one second fin in the second region, the second fin having a greater height than a height of the first fin.

In another illustrative example, a method is disclosed that includes forming first and second FinFET devices in and above a first region and a second region of a semiconducting substrate, respectively, forming a patterned mask layer above the substrate, wherein the patterned mask layer covers the second region and exposes the first region for further processing, and performing a first ion implantation process through the patterned masking layer to implant oxygen atoms into the first region. In this example, the method further includes the steps of removing the patterned mask layer, performing a heating process to cause the implanted oxygen atoms to combine with a material of the substrate to form a layer of insulating material in the first region and, after performing the heating process, performing at least one etching process to define at least one first fin in the first region and to define at least one second fin in the second region, the second fin having a greater height than a height of the first fin.

BRIEF DESCRIPTION OF THE DRAWINGS

The disclosure may be understood by reference to the following description taken in conjunction with the accompanying drawings, in which like reference numerals identify like elements, and in which.

Figure 1A:
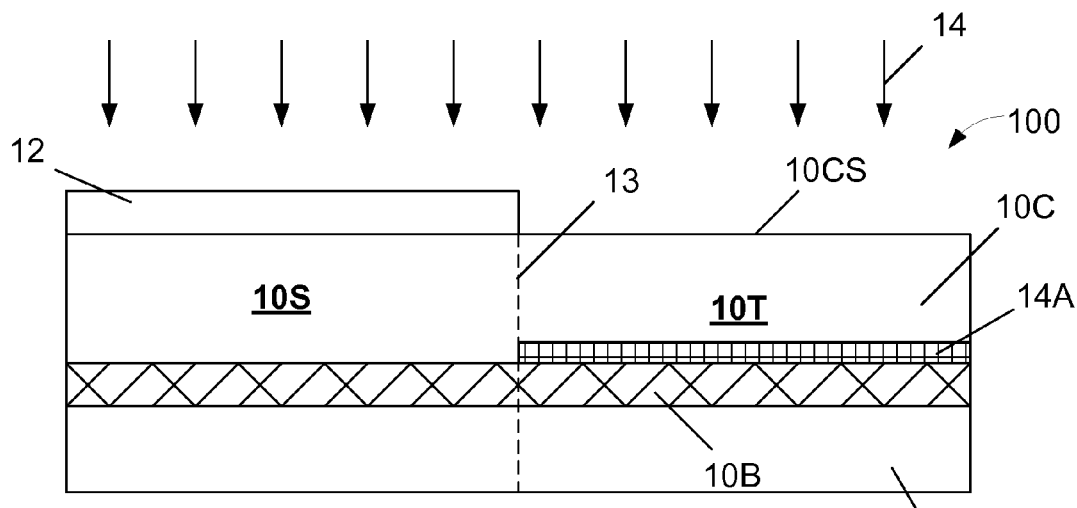
FIGS. 1A-1H depict various methods of forming FinFET semiconductor devices having different fin heights.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming FinFET semiconductor devices having different fin heights. As will be readily apparent to those skilled in the art upon a complete reading of the present application, the present method is applicable to a variety of devices, including, but not limited to, logic devices, memory devices, etc. With reference to the attached drawings, various illustrative embodiments of the methods and devices disclosed herein will now be described in more detail.

FIG. 1A is a simplified view of an illustrative FinFET semiconductor device 100 at an early stage of manufacturing. As described more fully below, the methods and devices disclosed herein may be formed in and above bulk substrates or so-called SOI (silicon-on-insulator) substrates. In the illustrative example depicted in FIGS. 1A-1D and 2A-2C, the device 100 is depicted as being formed in and above a SOI substrate 10 that includes a bulk silicon layer 10A, a buried insulation (BOX) layer 10B and an active layer 10C, wherein semiconductor devices are formed in and above the active layer 10C. The active layer 10C has an upper surface 10CS. In FIGS. 1E-1H and 2D-2F, the device 100 is depicted as being formed in and above a substrate 10 having a bulk silicon configuration. Thus, as used herein, the terms substrate or semiconductor substrate should be understood to cover all forms of semiconductor structures. The substrate 10 may also be made of materials other than silicon.

As shown in FIG. 1A, the substrate 10 is comprised of a region 10S, wherein a FinFET device with relatively shorter fins will be formed, and a region 10T, wherein a FinFET device with relatively taller fins will be formed. The dashed line 13 reflects that the regions 10S and 10T are separate regions of the substrate that are typically separated by an isolation structure (not shown). At the point of fabrication depicted in FIG. 1A, a patterned mask layer 12, such as a patterned hard mask layer or a photoresist mask, has been formed above the substrate 10 using known photolithography and etching techniques. The patterned mask layer 12 is intended to be representative in nature as it could by comprised of a variety of materials, such as, for example, a photoresist material, silicon nitride, silicon oxynitride, etc. Moreover, the patterned mask layer 12 could be comprised of multiple layers of material such as, for example, a pad oxide layer (not shown) that is formed on the substrate 10 and a silicon nitride layer (not shown) that is formed on the pad oxide layer. Thus, the particular form and composition of the patterned mask layer 12, and the manner in which it is made, should not be considered a limitation of the present invention. In the case where the patterned mask layer 12 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application. In this example, the patterned mask layer 12 covers the region 10S and exposes the region 10T for further processing.

As shown in FIG. 1A, an ion implantation process 14 is performed on the exposed portion of the substrate to form a schematically depicted implant region 14A in the substrate 10 approximately at the interface between the active region 10C and the BOX layer 10B, while the masked region 10S of the substrate 10 is protected from this ion implantation process 14. In one illustrative embodiment, the ion implantation process 14 is performed using nitrogen at a dopant dose of about $2e^{14}$-$1e^{15}$ ions/cm$^2$ and at an energy level of about 10-50 keV. In the case depicted here where the substrate 10 is an SOI substrate, the implant energy may be selected such that the peak concentration of the implanted material will be proximate the interface between the active layer 10C and the BOX layer 10B. The energy level of the ion implantation process 14 should be controlled such that little if any of the implanted materials pass through the patterned mask layer 12 into the region 10S.

Figure 1B:
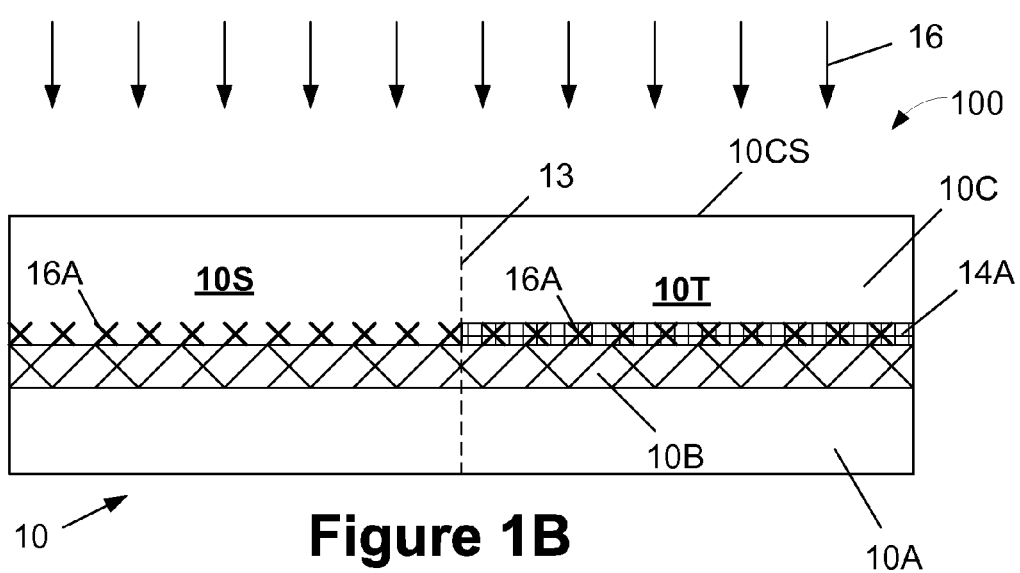

Next, as shown in FIG. 1B, the patterned mask layer 12 is removed and a blanket ion implantation process 16 is performed to implant oxygen atoms into both of the regions 10S and 10T and thereby form a schematically depicted implant region 16A in the substrate 10 proximate the interface between the active region 10C and the BOX layer 10B. In one illustrative embodiment, the ion implantation process 16 is performed using oxygen at a dopant dose of about 1.2-1.8× $10^{18}$ ions/cm$^2$ and at an energy level of about 10-50 keV. In the case where the substrate 10 is an SOI substrate, the implant energy of the implant process 16 may likewise be selected such that the peak concentration of the implanted oxygen 16A will be proximate the interface between the active layer 10C and the BOX layer 10B. The position of the peak concentration of the implanted oxygen can be adjusted to give optimal growth and crystal properties of the remaining silicon.

Figure 1C:
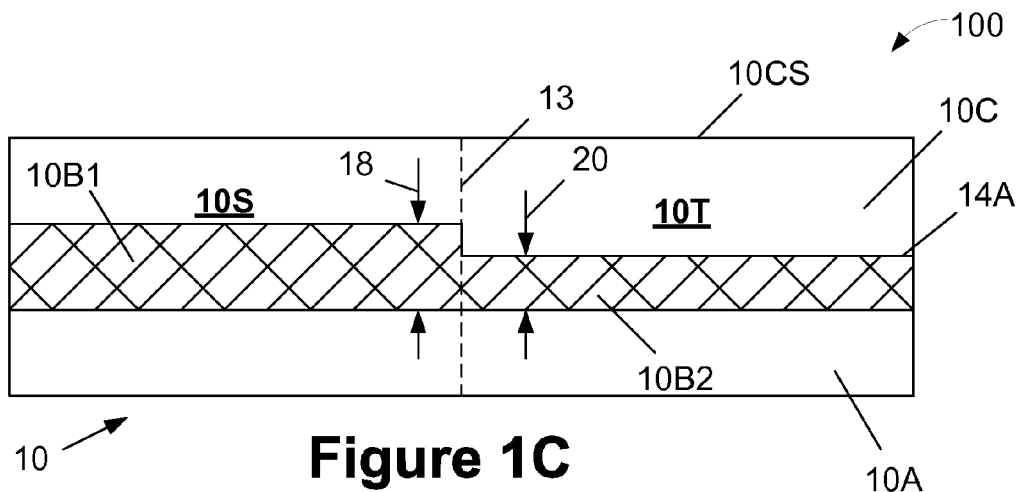

Next, as shown in FIG. 1C, a heating or anneal process is performed on the device 100 to create silicon dioxide in the areas of the substrate 10 having oxygen atoms implanted therein. This process results in a relatively thicker insulation layer 10B1, having a thickness 18, in the region 10S and a relatively thinner insulation layer 10B2, having a thickness 20, in the region 10T. The nitrogen implanted into the region 10T generally inhibits the formation of silicon dioxide in the region 10T, thus layer 10B2 is generally thinner than the layer 10B1. In one illustrative embodiment, this heating process may be performed at a temperature of about 950-1200° C. for a duration of about 0.5-1 minute. In effect, in the embodiment where an SOI substrate is employed, the processes used herein may add to the thickness of the original BOX layer 10B in at least the region 10S. In some cases, the final thickness 20 of the insulating layer 10B2 may be only slightly greater than the original thickness of the BOX layer 10B. The absolute values of the thicknesses 18, 20 may vary depending upon a variety of factors, such as the quantity of oxygen and nitrogen ions implanted into the substrate, the temperature and duration of the heating process, etc. In one illustrative embodiment, where the BOX layer 10B has an original thickness of about 100 nm, the thicknesses 18, 20 may be about 105-120 nm and 101-105 nm, respectively. The formation of insulating material in the region 10T is retarded due to the presence of the implanted nitrogen 14A which tends to occupy some of the lattice sites in the silicon active layer 10C, thereby reducing the chances for silicon to combine with the implanted oxygen 16A and form silicon dioxide.

Figure 1D:
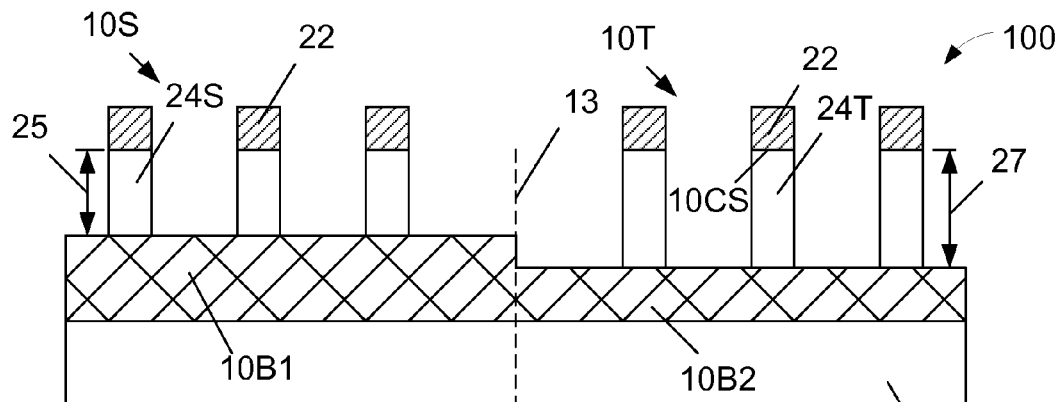

Then, as shown in FIG. 1D, a variety of process operations are performed to form a plurality of relatively shorter fins 24S in the region 10S and a plurality of relatively taller fins 24T in the region 10T. The fins 24S, 24T may be formed by performing traditional masking and etching processes, and the fins 24S, 24T may, in some embodiments, be formed at the same time using a common etch process. In the example depicted in FIG. 1D, a patterned mask layer 22 has been formed above the substrate 10 and one or more etching process have been performed to define the fins 24S, 24T. In one illustrative embodiment, the fins 24S may have a height 25 that may range from about 15-40 nm, while the height 27 of the fins 24T may be larger. The relative height difference between the fins 24S, 24T may vary depending upon the particular application. For example, in one illustrative embodiment, the fins 24T may be about 2-5 nm taller than the fins 24S. For example, in one illustrative embodiment, the fins 24T may be about 2-5 nm taller than the fins 24S. At the point of fabrication depicted in FIG. 1D, the masking layer 22 may be removed and the formation of the FinFET devices may proceed with traditional processing operations, e.g., the formation of gate structures, sidewall spacers, various doped source/drain regions (N or P), etc.

Figure 1E:
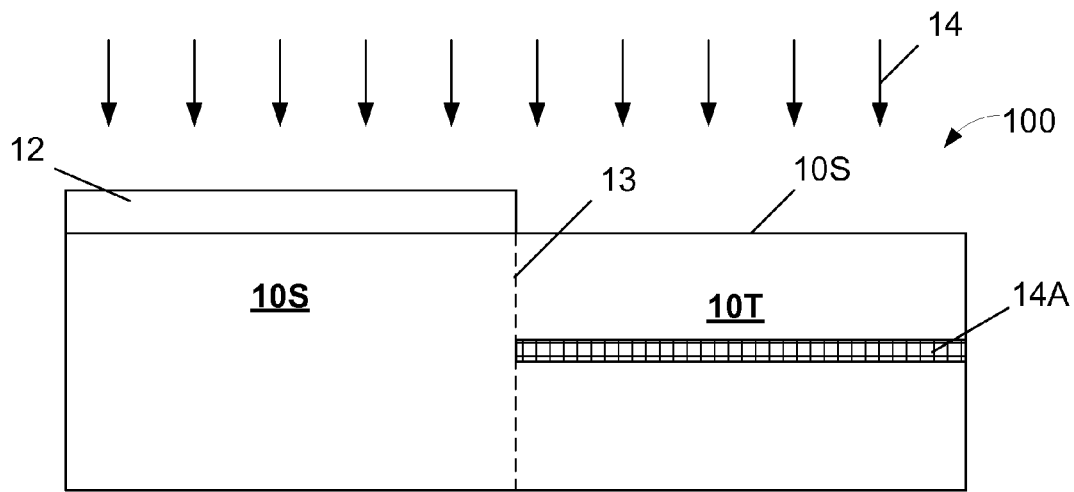

FIGS. 1E-1H depict the formation of the device 100 above a bulk silicon substrate 10. As shown in FIG. 1E, the bulk substrate 10 is also comprised of a region 10S, wherein a FinFET device with relatively shorter fins will be formed, and a region 10T, wherein a FinFET device with relatively taller fins will be formed. The dashed line 13 reflects that the regions 10S and 10T are separate regions of the substrate that are typically separated by an isolation structure (not shown).

At the point of fabrication depicted in FIG. 1E, the patterned mask layer 12 covers the region 10S and exposes the region 10T for further processing. Next, as shown in FIG. 1E, the nitrogen implantation process 14 is performed on the exposed portion of the substrate 10 to form a schematically depicted implant region 14A in the bulk substrate 10. In this embodiment, the energy level of the implantation process 14 is selected such that the peak concentration of the implanted material will be at a desired depth in the bulk substrate 10. As before, the energy level of the ion implantation process 14 should be controlled such that little if any of the implanted materials pass through the patterned mask layer 12 into the region 10S.

Figure 1F:
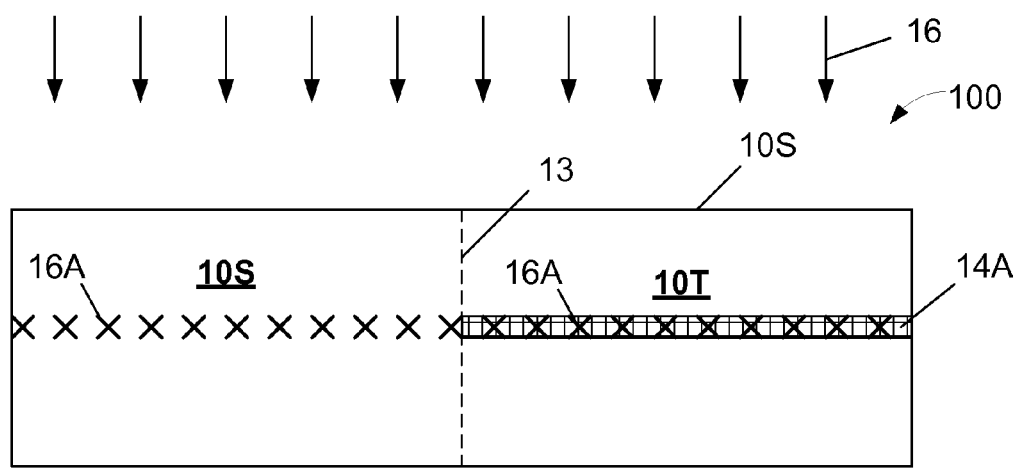

Then, as shown in FIG. 1F, the patterned mask layer 12 is removed and the blanket ion implantation process 16 is performed to implant oxygen atoms into both of the regions 10S and 10T and thereby form a schematically depicted implant region 16A in the bulk substrate 10 at the desired depth.

Figure 1G:
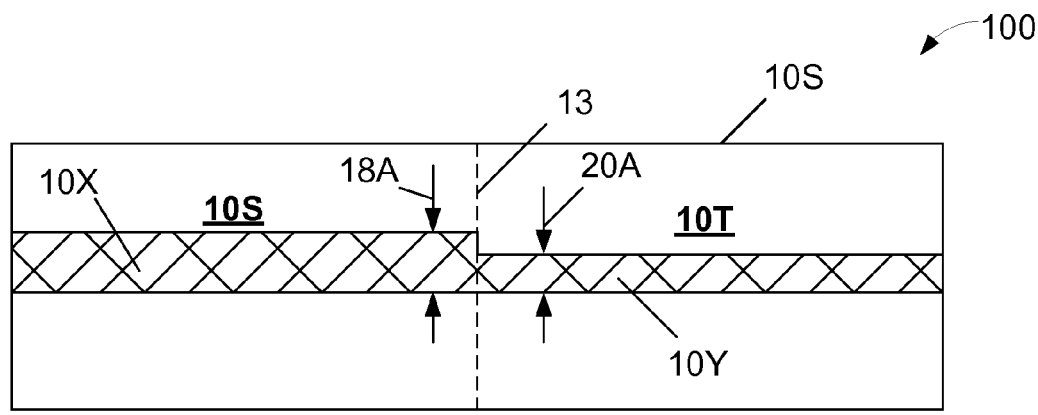

Next, as shown in FIG. 1G, a heating or anneal process is performed on the device 100 to create silicon dioxide in the areas of the substrate 10 having oxygen atoms implanted therein. This process results in a relatively thicker insulation layer 10X, having a thickness 18A, in the region 10S and a relatively thinner insulation layer 10Y, having a thickness 20A, in the region 10T. The absolute values of the thicknesses 18A, 20A may vary depending upon a variety of factors, such as the quantity of oxygen and nitrogen ions implanted into the substrate, the temperature and duration of the heating process, etc. In one illustrative embodiment, the thicknesses 18A, 20A may be about 10-25 nm and 5-15 nm, respectively. The formation of insulating material in the region 10T is retarded due to the presence of the implanted nitrogen 14A which tends to occupy some of the lattice sites in the bulk silicon substrate, thereby reducing the chances for silicon to combine with the implanted oxygen 16A and form silicon dioxide.

Figure 1H:
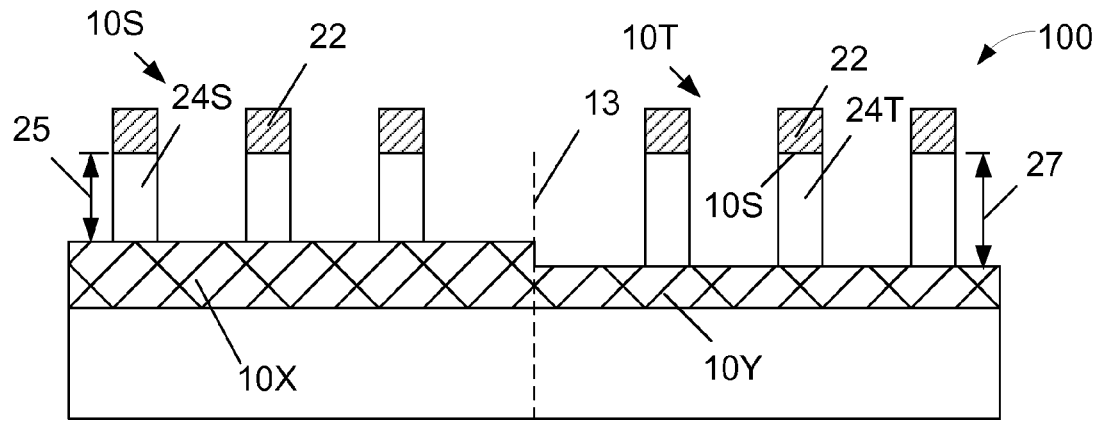

Then, as shown in FIG. 1H, a variety of process operations are performed to form a plurality of relatively shorter fins 24S in the region 10S and a plurality of relatively taller fins 24T in the region 10T. The fins 24S, 24T may be formed by performing traditional masking and etching processes, and the fins 24S, 24T may, in some embodiments, be formed at the same time using a common etch process. In the example depicted in FIG. 1H, a patterned mask layer 22 has been formed above the substrate 10 and one or more etching processes have been performed to define the fins 24S, 24T. In one illustrative embodiment, the fins 24S may have a height 25 that may range from about 15-40 nm, while the height 27 of the fins 24T may be larger. For example, in one illustrative embodiment, the fins 24T may be about 2-5 nm taller than the fins 24S. At the point of fabrication depicted in FIG. 1H, the masking layer 22 may be removed and the formation of the FinFET devices may proceed with traditional processing operations, e.g., the formation of gate structures, sidewall spacers, various doped source/drain regions (N or P), etc.

Figure 2A:
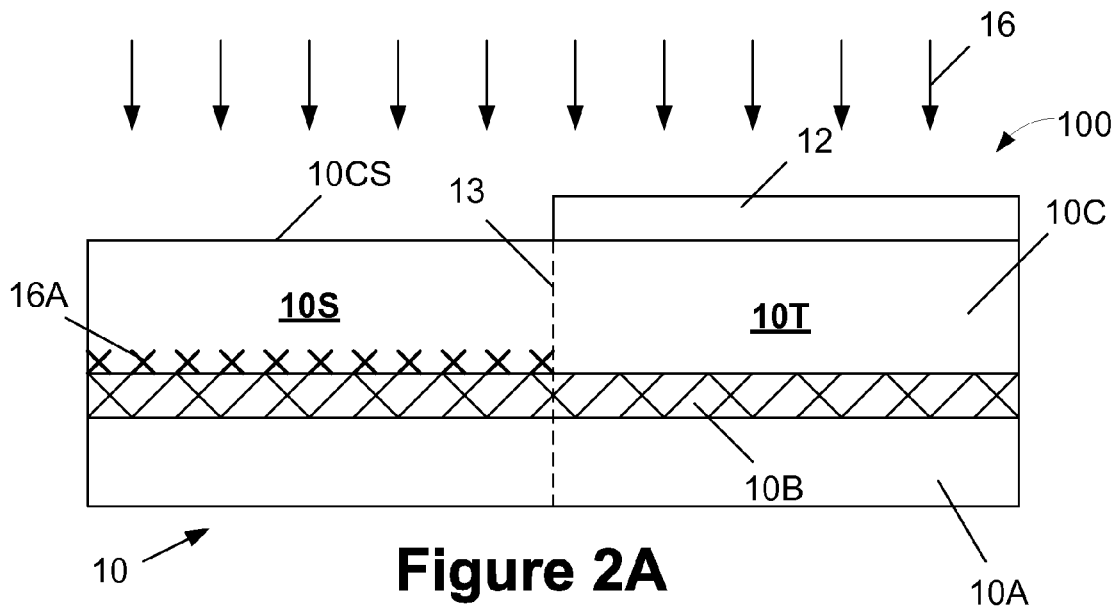
FIGS. 2A-2F depict yet other illustrative methods disclosed herein for forming FinFET semiconductor devices having different fin heights.
Figure 2B:
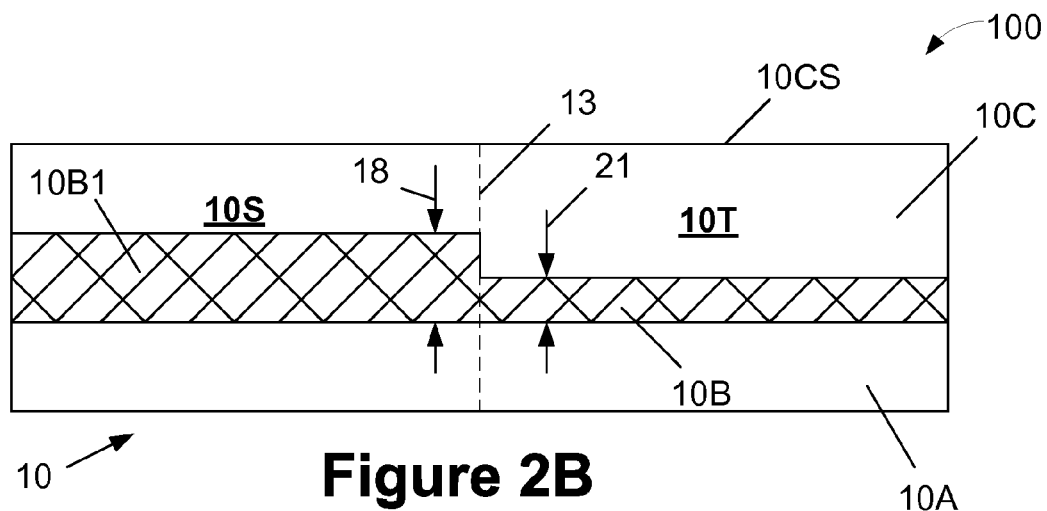
Figure 2C:
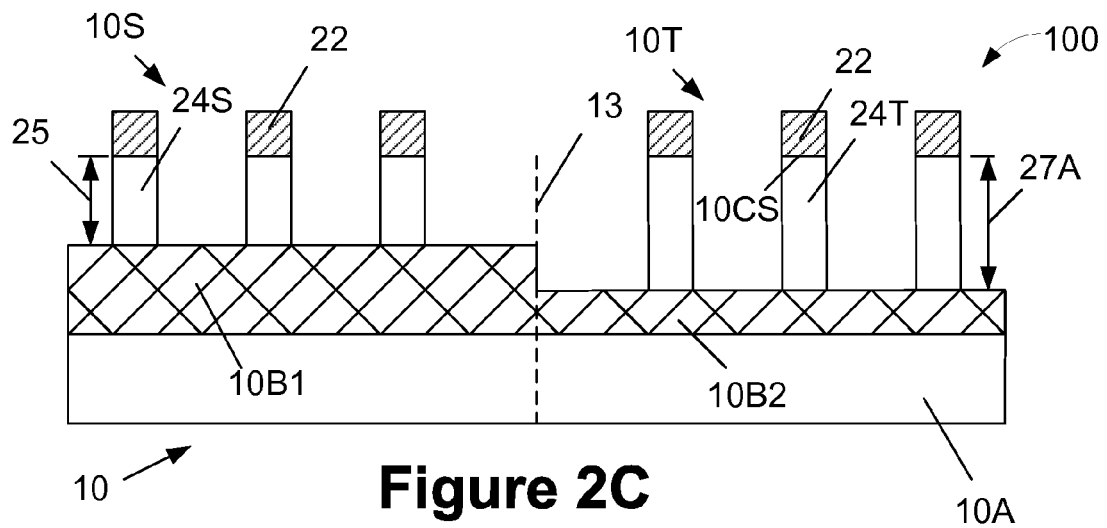
Figure 2D:
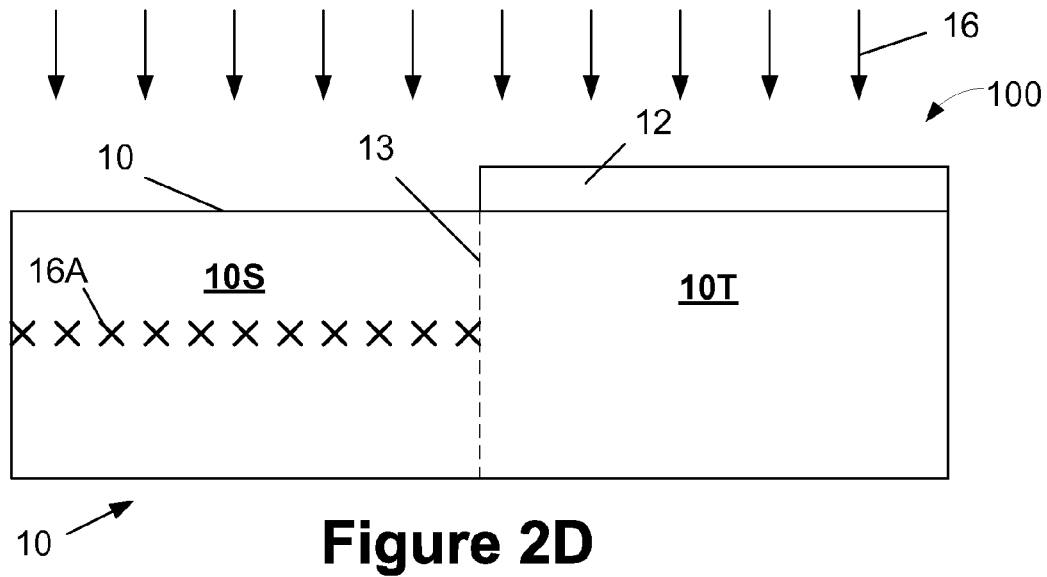
Figure 2E:
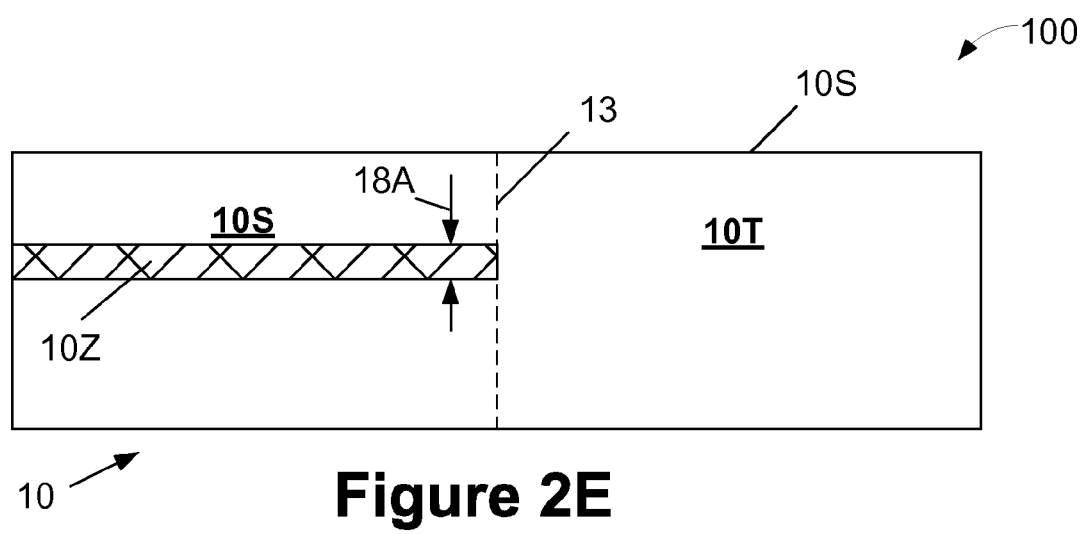
Figure 2F:
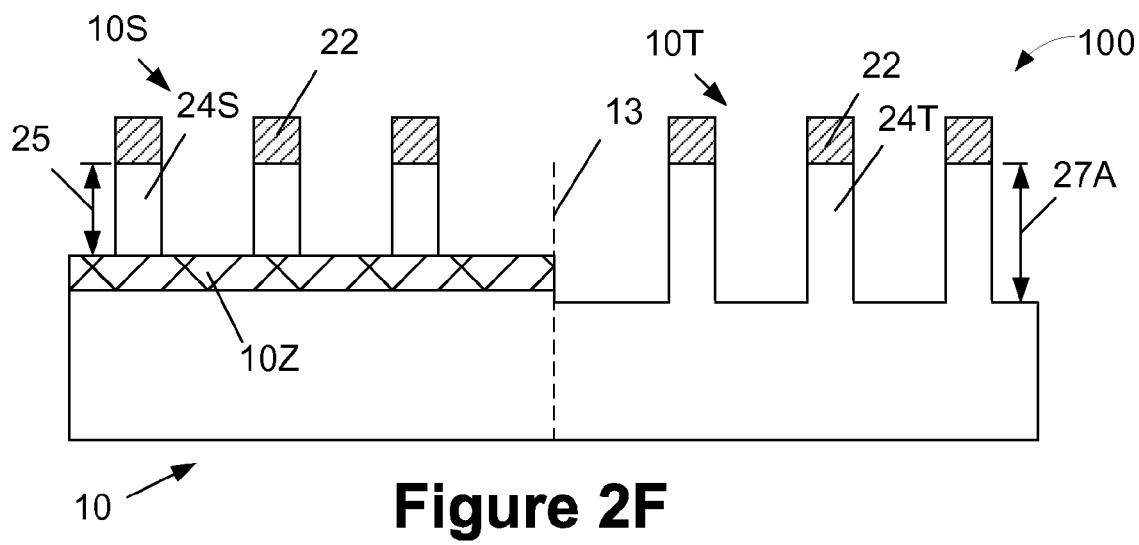

FIGS. 2A-2F depict various other methods disclosed herein for forming FinFETs with different fin heights. In the illustrative example depicted in FIGS. 2A-2C, the device 100 is depicted as being formed in and above an SOI substrate 10 that includes a bulk silicon layer 10A, a buried insulation (BOX) layer 10B and an active layer 10C, wherein semiconductor devices are formed in and above the active layer 10C. The active layer 10C has an upper surface 10CS. In FIGS. 2D-2F, the device 100 is depicted as being formed in and above a substrate 10 having a bulk silicon configuration.

As shown in FIG. 2A, the substrate 10 is comprised of a region 10S, wherein a FinFET device with relatively shorter fins will be formed, and a region 10T, wherein a FinFET device with relatively taller fins will be formed. The dashed line 13 reflects that the regions 10S and 10T are separate regions of the substrate that are typically separated by an isolation structure (not shown). At the point of fabrication depicted in FIG. 2A, the patterned mask layer 12 has been formed so as to cover the region 10T and expose the region 10S for further processing. As shown in FIG. 2A, the ion implantation process 16 is performed to implant oxygen atoms only into the region 10S and thereby form the schematically depicted implant region 16A in the substrate 10 proximate the interface between the active region 10C and the BOX layer 10B. In one illustrative embodiment, the ion implantation process 16 is performed using oxygen at a dopant dose of about $1.2-1.8\times10^{18}$ ions/cm$^2$ and at an energy level of about 10-50 keV. In the depicted example in FIG. 2A, where the substrate 10 is an SOI substrate, the implant energy of the implant process 16 may be selected such that the peak concentration of the implanted oxygen 16A will be proximate the interface between the active layer 10C and the BOX layer 10B.

Next, as shown in FIG. 2B, the patterned mask layer 12 is removed and a heating or anneal process is performed on the device 100 to create silicon dioxide in the areas of the substrate 10 having oxygen atoms implanted therein. This process results in a relatively thicker insulation layer 10B1, having a thickness 18, in the region 10S, while the BOX layer 10B in the region 10T retains its original thickness 21. In effect, in the embodiment where an SOI substrate is employed, the processes used herein may add to the thickness of the original BOX layer 10B in the region 10S while, in some cases, leaving the original thickness 21 of the BOX layer intact in the region 10T. The absolute values of the thicknesses 18, 21 may vary depending upon a variety of factors, such as the original starting thickness 21 of the BOX layer 10B, the quantity of oxygen and nitrogen ions implanted into the substrate, the temperature and duration of the heating process, etc. In one illustrative embodiment, where the BOX layer 10B has an original thickness 21 of about 100 nm, the thickness 18 may be about 105-120 nm.

Then, as shown in FIG. 2C, a variety of process operations are performed to form a plurality of relatively shorter fins 24S in the region 10S and a plurality of relatively taller fins 24T in the region 10T as described previously. That is, the fins 24S, 24T may be formed by performing traditional masking and etching processes, and the fins 24S, 24T may, in some embodiments, be formed at the same time using a common etch process. The relative height difference between the fins 24S, 24T may vary depending upon the particular application. For example, in one illustrative embodiment, the fins 24T may be about 2-5 nm taller than the fins 24S. At the point of fabrication depicted in FIG. 1D, the masking layer 22 may be removed and the formation of the FinFET devices may proceed with traditional processing operations, e.g., the formation of gate structures, sidewall spacers, various doped source/drain regions (N or P), etc.

FIGS. 2D-2F depict the formation of the device 100 above a bulk silicon substrate 10. As shown in FIG. 2D, the bulk substrate 10 is also comprised of a region 10S, wherein a FinFET device with relatively shorter fins will be formed, and a region 10T, wherein a FinFET device with relatively taller fins will be formed. The dashed line 13 reflects that the regions 10S and 10T are separate regions of the substrate that are typically separated by an isolation structure (not shown).

At the point of fabrication depicted in FIG. 2D, the patterned mask layer 12 covers the region 10T and exposes the region 10S for further processing. Next, as shown in FIG. 2D, the ion implantation process 16 is performed through the patterned mask layer 12 on the exposed portion of the substrate 10 to implant oxygen atoms only into the region 10S and thereby form a schematically depicted implant region 16A in the bulk substrate 10 at the desired depth.

Then, as shown in FIG. 2E, the patterned mask layer 12 is removed and a heating or anneal process is performed on the device 100 to create silicon dioxide in the areas of the substrate 10 having oxygen atoms implanted therein. This process results in an insulation layer 10Z of silicon dioxide, having a thickness 18A in the region 10S. The absolute value of the thickness 18A may vary depending upon a variety of factors, such as the quantity of oxygen and nitrogen ions implanted into the substrate, the temperature and duration of the heating process, etc. In one illustrative embodiment, the thickness 18A may be about 5-25 nm.

Then, as shown in FIG. 2F, a variety of process operations are performed to form a plurality of relatively shorter fins 24S in the region 10S and a plurality of relatively taller fins 24T in the region 10T. As discussed above, the fins 24S, 24T may be formed by performing traditional masking and etching processes, and the fins 24S, 24T may, in some embodiments, be formed at the same time using a common etch process. In one illustrative embodiment, the fins 24S may have a height 25 that may range from about 15-40 nm, while the height 27A of the fins 24T may be larger. For example, in one illustrative embodiment, the fins 24T may be about 2-5 nm taller than the fins 24S. At the point of fabrication depicted in FIG. 2F, the masking layer 22 may be removed and the formation of the FinFET devices may proceed with traditional processing operations, e.g., the formation of gate structures, sidewall spacers, various doped source/drain regions (N or P), etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming first and second FinFET devices in and above a first region and a second region of a semiconducting substrate, respectively, wherein said second FinFET device has a fin height that is greater than a fin height of said first FinFET device, the method comprising:

forming a patterned mask layer above said substrate, said patterned mask layer covering said first region and exposing said second region for further processing;

performing a first ion implantation process through said patterned mask layer to implant nitrogen into said second region;

removing said patterned mask layer;

performing a second ion implantation process to implant oxygen atoms into both said first and second regions;

performing a heating process to cause said implanted oxygen atoms to combine with a material of said substrate to form a layer of insulating material at least in said first region; and after performing said heating process, performing at least one etching process to define at least one first fin in said first region and to define at least one second fin in said second region, said second fin having a greater height than a height of said first fin.

2. The method of claim 1, wherein said semiconducting substrate is a silicon-on-insulator substrate.

3. The method of claim 1, wherein said semiconducting substrate is a bulk silicon substrate.

4. The method of claim 1, wherein said first ion implantation process is performed using a dopant dose of about $2e^{14}$-$1e^{15}$ ions/cm$^2$ and at an energy level of about 10-50 keV.

5. The method of claim 1, wherein said second ion implantation process is performed using a dopant dose of about 1.2-1.8×10$^{18}$ ions/cm$^2$ and at an energy level of about 10-50 keV.

6. The method of claim 1, wherein said heating process is performed at a temperature of about 950-1200° C. for a duration of about 0.5-1 minute.

7. A method of forming first and second FinFET devices in and above a first region and a second region of an SOI substrate, respectively, said SOI substrate comprising a buried insulation layer and an active layer positioned above the buried insulation layer, wherein said second FinFET device has a fin height that is greater than a fin height of said first FinFET device, the method comprising:
    forming a patterned mask layer above said active layer of said substrate, said patterned mask layer covering said first region and exposing said second region for further processing;
    performing a first ion implantation process through said patterned mask layer to implant nitrogen into said second region at a location proximate an interface between said active layer and said buried insulation layer;
    removing said patterned mask layer;
    performing a second ion implantation process to implant oxygen atoms into both said first and second regions at a location proximate said interface between said active layer and said buried insulation layer;
    performing a heating process to cause said implanted oxygen atoms to combine with a material of said substrate to form a layer of insulating material at least in said first region; and
    after performing said heating process, performing at least one etching process to define at least one first fin in said first region and to define at least one second fin in said second region, said second fin having a greater height than a height of said first fin.

8. The method of claim 7, wherein said first ion implantation process is performed using a dopant dose of about $2e^{14}$-$1e^{15}$ ions/cm$^2$ and at an energy level of about 10-50 keV.

9. The method of claim 7, wherein said second ion implantation process is performed using a dopant dose of about 1.2-1.8×10$^{18}$ ions/cm$^2$ and at an energy level of about 10-50 keV.

10. The method of claim 7, wherein said heating process is performed at a temperature of about 950-1200° C. for a duration of about 0.5-1 minute.

11. A method of forming first and second FinFET devices in and above a first region and a second region of a semiconducting substrate, respectively, wherein said second FinFET device has a fin height that is greater than a fin height of said first FinFET device, the method comprising:
    forming a patterned mask layer above said substrate, said patterned mask layer covering said second region and exposing said first region for further processing;
    performing a first ion implantation process through said patterned mask layer to implant oxygen atoms into said first region;
    removing said patterned mask layer;
    performing a heating process to cause said implanted oxygen atoms to combine with a material of said substrate to form a layer of insulating material in said first region; and
    after performing said heating process, performing at least one etching process to define at least one first fin in said first region and to define at least one second fin in said second region, said second fin having a greater height than a height of said first fin.

12. The method of claim 11, wherein said semiconducting substrate is a silicon-on-insulator substrate.

13. The method of claim 11, wherein said semiconducting substrate is a bulk silicon substrate.

14. The method of claim 11, said first ion implantation process is performed using a dopant dose of about 1.2-1.8×10$^{18}$ ions/cm$^2$ and at an energy level of about 10-50 keV.

15. The method of claim 11, wherein said heating process is performed at a temperature of about 950-1200° C. for a duration of about 0.5-1 minute.

16. A method of forming first and second FinFET devices in and above a first region and a second region of an SOI substrate, respectively, said SOI substrate comprising a buried insulation layer and an active layer positioned above the buried insulation layer, wherein said second FinFET device has a fin height that is greater than a fin height of said first FinFET device, the method comprising:
    forming a patterned mask layer above said substrate, said patterned mask layer covering said second region and exposing said first region for further processing;
    performing a first ion implantation process through said patterned mask layer to implant oxygen atoms into said first region at a location proximate an interface between said active layer and said buried insulation layer;
    removing said patterned mask layer;
    performing a heating process to cause said implanted oxygen atoms to combine with a material of said substrate to form a layer of insulating material in said first region; and
    after performing said heating process, performing at least one etching process to define at least one first fin in said first region and to define at least one second fin in said second region, said second fin having a greater height than a height of said first fin.

17. The method of claim 16, said first ion implantation process is performed using a dopant dose of about 1.2-1.8×10$^{18}$ ions/cm$^2$ and at an energy level of about 10-50 keV.

18. The method of claim 16, wherein said heating process is performed at a temperature of about 950-1200° C. for a duration of about 0.5-1 minute.

* * * * *